United States Patent [19]

Muellner

[11] Patent Number: 4,494,212
[45] Date of Patent: Jan. 15, 1985

[54] VARIABLE GAIN AMPLIFIER

[75] Inventor: William C. Muellner, Lagrange Park, Ill.

[73] Assignee: The Perkin-Elmer Corporation, Norwalk, Conn.

[21] Appl. No.: 628,547

[22] Filed: Jul. 6, 1984

Related U.S. Application Data

[63] Continuation of Ser. No. 354,408, Mar. 3, 1982, abandoned.

[51] Int. Cl.³ ............................................. G06F 15/20
[52] U.S. Cl. .................................. 364/571; 330/278; 328/168
[58] Field of Search ............... 364/480, 571; 340/347 CC; 330/129, 278, 279; 307/264; 328/168; 381/104; 455/234, 247, 251; 375/11, 12, 98; 358/174

[56] References Cited

U.S. PATENT DOCUMENTS

| 4,191,995 | 3/1980 | Farrow | 328/168 |
| 4,213,097 | 7/1980 | Chiu et al. | 330/279 |
| 4,270,177 | 5/1981 | Endoh et al. | 340/347 CC |
| 4,301,510 | 11/1981 | Ricciardi et al. | 364/571 |
| 4,356,731 | 11/1982 | Mahony | 364/571 |
| 4,412,182 | 10/1983 | Yochum | 330/129 |

Primary Examiner—Gary Chin
Attorney, Agent, or Firm—Thomas P. Murphy; Edwin T. Grimes; Francis L. Masselle

[57] ABSTRACT

A variable gain amplifier with digital output is described. The amplifier is useful for but not limited to input range selection in chart recorders or other measuring instruments. To minimize the number of expensive presision resistors used in the gain selection network each selected range is approximated by switching. A software routine then adjusts the gain after digitizing to the correct value for the selected range. Both range switching and gain correction are controlled by a general purpose microprocessor which also is available for other duties in the instrument.

8 Claims, 4 Drawing Figures

| INPUT RANGE (mV/FULLSCALE) | CORRECT GAIN | RAW GAIN SCALE | RAW OUTPUT VOLTAGE (mV) | SWITCH POSITIONS O = OPEN; X = CLOSED ||||| 
|---|---|---|---|---|---|---|---|---|
| | | | | SW-1 | SW-2 | SW-3 | SW-4 | SW-5 |
| 1 | 2000 | 2001.00 | 2001 | O | O | X | X | O |
| 2 | 1000 | 1001.00 | 2002 | O | O | X | O | X |
| 5 | 400 | 398.6056 | 1993 | O | O | O | X | O |
| 10 | 200 | 200.0095 | 2000 | O | X | X | X | O |
| 20 | 100 | 100.5047 | 2010 | O | X | X | O | X |
| 50 | 40 | 39.8425 | 1992 | O | X | O | X | O |
| 100 | 20 | 19.3567 | 1936 | X | O | X | X | O |
| 200 | 10 | 10.2634 | 2053 | X | O | X | O | X |
| 500 | 4 | 3.690 | 1845 | X | O | O | X | O |
| 1000 | 2 | 2.044 | 2044 | X | O | O | O | X |

```
01720  00172P  00DC 07 00     A FUDGER  STAB  TEMPAD    ⎫ SAVE A/D READING IN "TEMPAD."
01730  00173P  00DE 97 01              STAA  TEMPAD+1  ⎭
01740  00174P  00E0 DE 00              LDX   FDGPTR    ⎫
01750  00175P  00E2 E6 00              LDAB  0,X       ⎬ GET CONSTANT FOR DETERMINING GAIN ON PARTICULAR.
01760  00176P  00E4 D7 00              STAB  FUDGE     ⎭
01770  00177P  00E6 D6 00              LDAB  TEMPAD
01780  00178P  00E8 7D 0000 A MORFDG   TST   FUDGE     ─── TEST IF ALL BITS Ø -i.e. NO MORE ADJUSTING.
01790  00179P  00EB 27 15 0102         BEQ   NOFDG
01800  00180P  00ED 74 0000 A          LSR   FUDGE     ⎫ TEST BIT
01810  00181P  00F0 24 0C 00FE         BCC   REVOLV    ⎭
01820  00182P  00F2 36                 PSHA
01830  00183P  00F3 37                 PSHB          ⎫
01840  00184P  00F4 9B 01              ADDA  TEMPAD+1  ⎬ IF BIT IS A ONE, ADD ACCUMULATORS TO A/D VALUE
01850  00185P  00F6 D9 00              ADCB  TEMPAD    ⎬              AND SAVE.
01860  00186P  00F8 97 01              STAA  TEMPAD+1  ⎭
01870  00187P  00FA D7 00              STAB  TEMPAD
01880  00188P  00FC 33                 PULB
01890  00189P  00FD 32                 PULA
01900  00190P  00FE 57     REVOLV      ASRB            ⎫ ROTATE A/D VALUE IN ACCUMULATORS (i.e. ÷ 2)
01910  00191P  00FF 46                 RORA            ⎭
01920  00192P  0100 20 E6 00E8         BRA   MOREDG  ─── REPEAT
01930  00193P  0102 96 01 A NOFDG      LDAA  TEMPAD+1  ⎫ SEND TO MOTOR DRIVE ROUTINE
01940  00194P  0104 D6 00              LDAB  TEMPAD    ⎭
01950  00195P  0106 39                 RTS
01960  00196                           END
TOTAL ERRORS 00000 00000
```

FIG. 4

VARIABLE GAIN AMPLIFIER

RELATED PATENT APPLICATIONS

This application is a continuation of application Ser. No. 354,408, filed Mar. 3, 1982, now abandoned.

This application is related to the following three U.S. Patents, which were filed on even date herewith, (1) U.S. Pat. No. 4,430,657, entitled "Pen Drive for Recorder", by Larkin B. Scott and William C. Muellner; (2) U.S. Pat. No. 4,425,571, entitled "Chart Recorder", by William C. Muellner and Larry E. Plunkett; and (3) U.S. Pat. No. 4,426,651, entitled: "Strip Chart Recorder", by William C. Meullner and Walter Hvostik.

BACKGROUND OF THE INVENTION

The class of instruments used for measurement and recording of data expressed as voltage, current, etc. and including such devices as chart recorders, digital voltmeters and the like, usually have input means for selecting one of a plurality of input ranges. The most common means is a manually switched series of voltage dividers which may be in combination with an input amplifier the gain of which is set by said switching. Switching may also be effected automatically by auto-ranging circuits which select a gain which keeps the displayed readout value within display limits, or in the case of a digital display, shift the decimal point appropriately. To maintain accuracy from range to range, each range requires a divider branch to establish a voltage or gain ratio appropriate to the particular range. Where a number of ranges are provided in a multirange instrument the values of the ratios involved may be difficult to provide with low cost resistors of standard commercial values and the number of special valued, high cost resistors may be undersireably large.

The number of special resistors required may be reduced by devising economical switched resistor networks wherein commercial valued resistors may be used, each resistor being in circuit for more than one selected range. However, the approximate ratios so obtained for the several switching modes are unlikely to be exactly the desired ratio values, but deviate therefrom by a significant amount. This situation is aggravated by the wide tolerances of low cost resistors.

Therefore it is an objective of the invention to provide the improvement of a microprocessor controlled correction to each of said approximate ratios of such an economical switched circuit to obtain the desired exact ratio.

It is a further objective of the invention to have the same microprocessor direct the requisite switching for each range entirely through the use of solid state components so as to avoid the problems associated with moving contacts, relays and the like.

Another objective of the invention is to use the same microprocessor for correction and switching that is responsible for other measurement, computation and control functions of the instrument utilizing my invention.

Yet another objective is to provide internal means whereby the necessary factor for use in the routine for ratio correction may be made available to the microprocessor.

BRIEF DESCRIPTION OF THE INVENTION

The foregoing and other objectives and functional relationships of the gain controlled amplifier disclosed herein as a preferred embodiment of the invention will be exemplified by considering this amplifier to be the input amplifier of a multirange chart recorder. Various functions of this recorder are microprocessor controlled and are considered in detail in the related Patent Applications previously listed in this Patent Application. The input amplifier of this invention comprises an operational amplifier arranged in a non-inverting feedback mode. A multipath resistor network in the feedback and output branch of this amplifier may be switched into a plurality of configurations utilizing semiconductor switches controlled by the microprocessor setting bit values in a peripheral interface adaptor (PIA) latch. The output branch of this resistor network is a divider of which the upper component may be shorted out to change the output by a factor of five. The output goes from this divider to an analog to digital converter (ADC) which converts this output to digital form and stores it in a register for subsequent software correction.

Because of the limited number of resistors and switches used in this gain control network the desired exact ratios for the ten gain ratios of this exemplification can only be approximated. I have devised a routine that acquires for each range a correction or fudge factor (denoted in the software routine as FUDGE) and multiplies the approximate or raw output from the ADC by this correction factor to secure a corrected digital output value for this range. This corrected value is utilized subsequently in the recorder. The central microprocessor that controls other functions of the recorder directs its attention to this routine at predetermined intervals. The output values, after correction, are stored by the microprocessor for use in the recorder servo routine.

BRIEF DESCRIPTION OF THE DRAWINGS

The foregoing and other objects, advantages and features of the present invention are described below in further detail in connection with the drawings which form a part of the disclosure wherein:

FIG. 4 is a typical object code for the software routine.

DETAILED DESCRIPTION

Figures 1, 2:
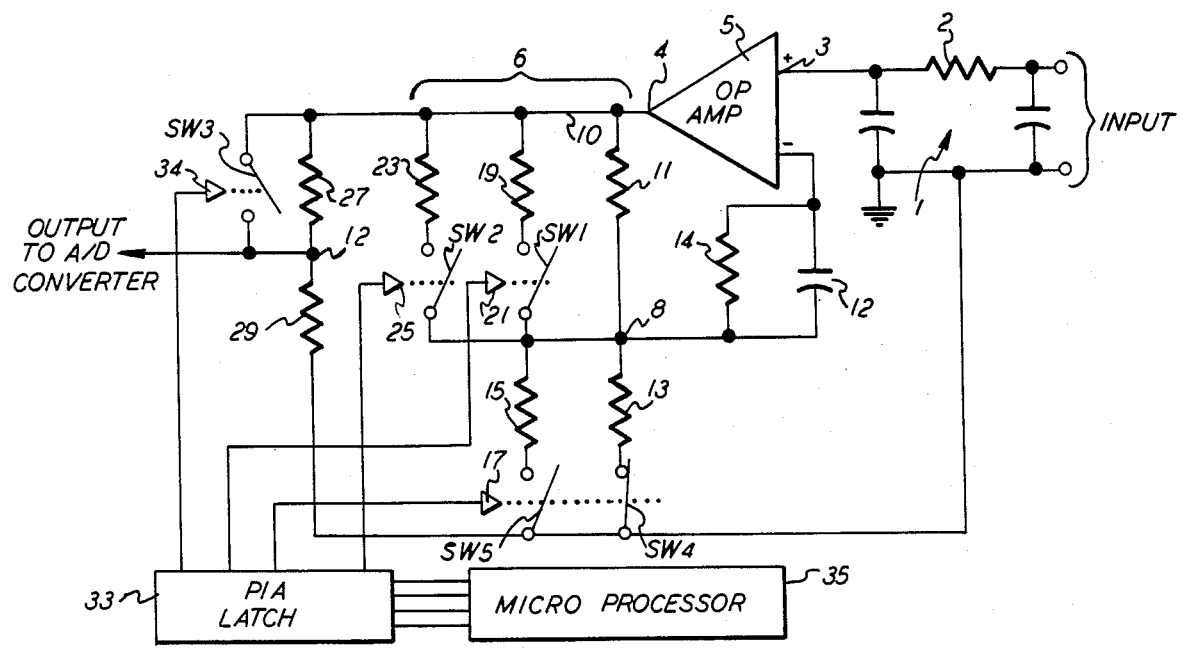
FIG. 1 is a simplified schematic diagram of the analog amplifier of the invention.
FIG. 2 is a code table for range switching.

Referring to FIG. 1, which shows a schematic diagram of the analog amplifier circuit of the invention, an analog signal which is to be measured is applied to the input terminals of a simple filter 1 which minimizes noise spikes and such artifacts and contains the usual offset-balancing resistor 2. One side, the low side, of the input is normally grounded to the instrument chassis; the other is connected to the plus or non-inverting terminal 3 of a conventional operational amplifier 5 (commonly referred to as an "op amp"). The op amp may typically be one known as Type 07 made by Analog Devices, Inc. or other manufacturers, although other similar types will also be satisfactory for use in the invention.

The output 4 of the op amp 5 is connected to the high side conductor 10 of a switchable feedback network 6. Connected between this high side conductor and ground is a first divider comprising resistor 11 and either resistor 13 or resistor 15 depending on the state of two mutually exclusive switches labelled SW-4 and SW-5 respectively in the figure. These switches shown here in functional form are part of the semiconductor switch 17 which may be half of the digital gate device known as DG 390 manufactured by Siliconix or other manufacturers in the field. Also connected to the high side conductor 10 is a first shunt resistor 19 which may be switched to parallel resistor 11 by the operating switch SW1 of the digital gate device 21. Similarly, a second shunt resistor 23 is also connected to the high side conductor 10 and may be switched to parallel resistor 11 by operating switch SW2 of digital gate device 25. These digital gate devices are each one-quarter of digital gate device DG201 made by the same manufacturer. It will be apparent that the ratio of the voltage appearing at mid point 8 of the divider comprising resistors 11, 19, 25, 13 and 15 to the voltage appearing at output 4 will take one of several values depending on the states of the switches SW1, SW2, SW4 and SW5. The mid point 8 is returned to the inverting input terminal of the op amp 5 in the usual manner through the conventional offset balancing resistor 14 and oscillation suppressing capacitor 12. The voltage gain of a feedback amplifier circuit of this type is inversely proportional to the ratio of the voltage at mid point 8 compared to the voltage at output 4 and hence is determined by the states of the switches.

An output divider comprising resistor 27 and resistor 29 is also connected between the high side conductor 10 and ground. A digital gate 34 consisting of one-quarter of device DG201 and functioning as switch SW-3 can short out resistor 27 thus changing the divider ratio by a factor of approximately five. The mid point 12 of this divider is connected to the input of an analog to digital converter (ADC) which digitizes the output voltage appearing at point 12.

The switching functions effected by the digital gates are determined by a microprocessor 35 which addresses a peripheral interface adaptor 33 (PIA) using the output ports of the PIA as latches to set the digital gate switches in the open or closed position as determined by a bit code set up by the microprocessor according to the range selected. FIG. 2 shows a table of switch positions and the resulting analog gains corresponding thereto for the illustrative embodiment.

Although the analog gain values resulting from switching may approximate the desired corrected gain values, I have found it possible to improve the gain accuracy by a software correction applied by the microprocessor to the digitized ADC output value ("raw" ADC output). In the simplest version of this software correction, a correction code factor, designated as FUDGE in the software routine, is predetermined for each gain range and stored in memory. The microprocessor secures this code from memory and applies it to the digitized ADC output value using this formula:

Corrected ADC Output = Raw ADC Output + $1/N$(Raw ADC Output).

Figure 3:
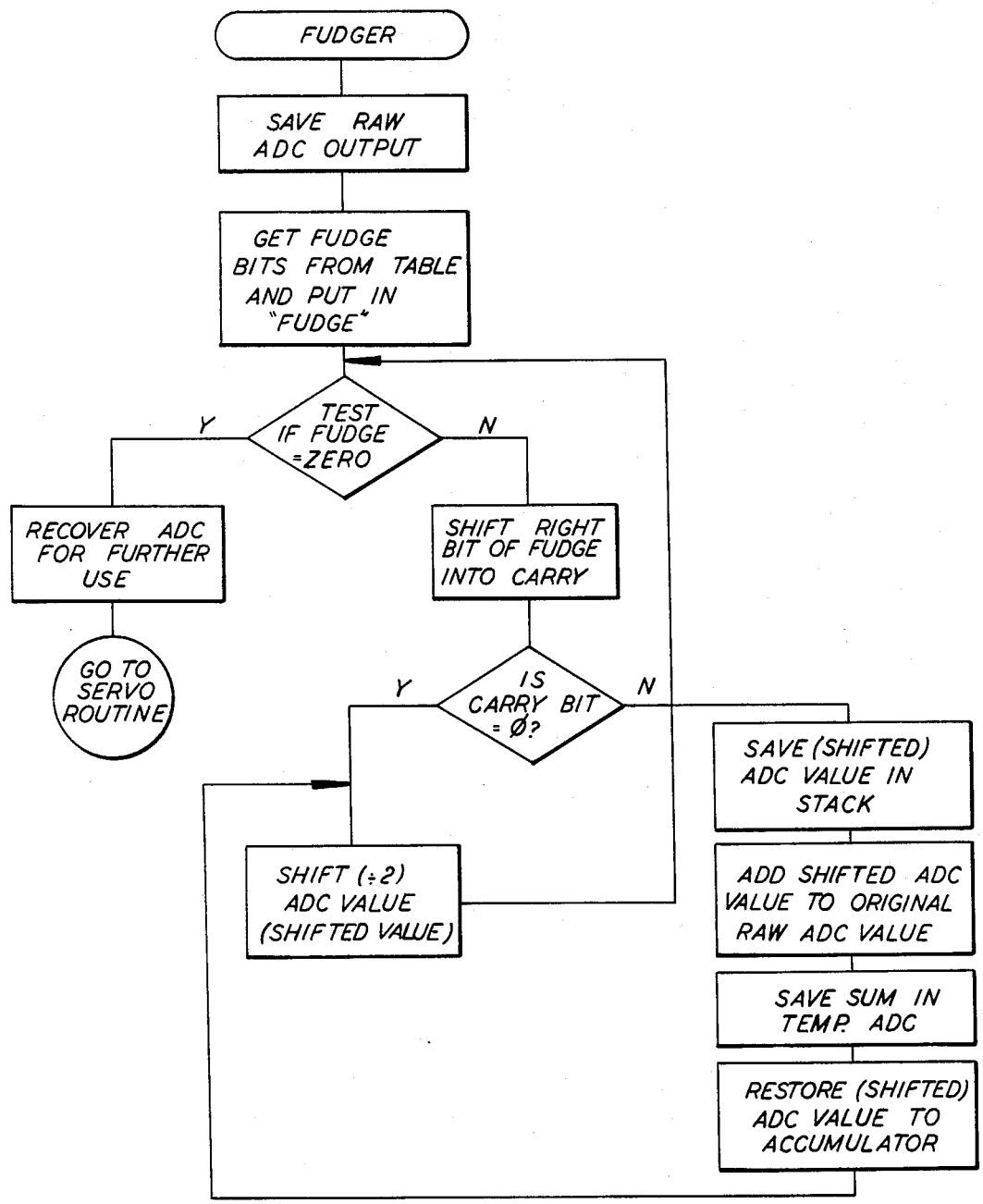
FIG. 3 is a simplified flow chart of the software routine.

The factor $1/N$ is derived by the subroutine from FUDGE and applied using the shift and add routine shown in the flowchart of FIG. 3 and the "FUDGER" service routine object code of FIG. 4. Thus, by a combination of this software routine and a switched hardware resistance network, the desired corrected ADC output is secured.

To exemplify the derivation and use of the FUDGE code consider a range where the analog gain set up by the switched network in the 500 mV range computes to be 3.690. The analog output voltage is then 1845 mV. To simplify this example assume the ADC reference voltage is such that the "raw" ADC output is then also 1845 mV. Assume also that a corrected ADC output of 2000 mV is wanted, equivalent to 2000 counts, for full scale on the recorder. Using the formula above:

$$2000 = 1845 + (1845/N)$$

From this, $1845/N = 2000 - 1845 = 155$.

Solving, $N = 11.903$; $1/N = 0.08401$. In binary form this is 00010101. I have found it possible to greatly simplify the software correction routine by the novel and non-obvious procedure of reversing this $1/N$ value and shifting it one digit to the left, thus securing the code for FUDGE used in the software routine. Performing this operation a value for FUDGE is binary form of 101010000 is formed. This may not be put in one byte as 01010000 by omitting the most significant bit, which will produce an approximate corrected ADC output of 1989 from the routine. Or FUDGE may be extended to two bytes for greater accuracy in which case one can compute $1/N$ to 12 to 16 bits, reverse it and shift left giving the FUDGE code of 1101010000 which will produce a corrected ADC output of 1999.95 from the routine. It is also expedient sometimes to arbitrarily modify FUDGE by inspection, as will be apparent to one familiar with binary numbers, to encode it for a closer result while still staying within one byte. An example of such a case is to use 11010000 for FUDGE which produces 2003.6 for the corrected ADC output. This modification of FUDGE to keep it in one byte may be more generally effective if the software gain correction is arbitrarily increased to a higher value in the same ratio on all ranges; a practice which would also eliminate negative $1/N$ values. Keeping FUDGE in one byte may be very helpful or even necessary if memory space is limited; the shortness of this novel software routine is also helpful with short memories. The higher software correction may often be selected to eliminate necessity of correction on some ranges. Where the higher software correction is utilized a change of the ADC reference voltage will bring the final output back to the desired value for all ranges, e.g., 2000 mV in this embodiment.

This novel combination of software and hardware gain control makes possible further advantages. In the foregoing simple example it is assumed that resistors of such a precision are used that variation of gain from one instrument to another due to resistor tolerance variations is insignificant. However, it is an additional feature of the invention that by selection or numerical adjustment of the FUDGE code for any range the raw gain error due to resistor variation can be closely corrected through the software routine. Determination of the required FUDGE code value may be made by impressing a known voltage on the analog amplifier input and determining the FUDGE code which will produce the desired corresponding digital output value, thus effecting the correct overall gain. This FUDGE code is then stored in a non-volatile memory for use in the FUDGER subroutine.

A further extension of the scope of the invention comprises an automatic gain correction routine through the microprocessor each time a range is selected. A known voltage is provided to the analog input. This voltage may be delivered by an internal digitally controlled voltage reference device such as the AD584 Pin Programmable Presicion Voltage Reference manufactured by Analog Devices, Inc. which has an accuracy of 0.1 percent or better. This microprocessor then reads the raw ADC output as described above and determines the FUDGE code necessary to correct this output, storing the FUDGE code thus determined in RAM. This process is repeated for each range selected and being carried out as often as required can compensate for any temporal variation affecting gain.

It should be apparent that notwithstanding the advantages previously stated of using solid state switching means in the feedback network the essence of this invention can also be practiced by the use of mechanical or manual switching or even, in the case of a single gain range, no switching at all.

Although I have described in detail the operation and features of the preferred embodiment, I do not wish to be limited to the particular use and construction exemplified. It should be apparent that this amplifier with software gain control can readily be adapted to many applications where an amplifier of accurately known gain is desired. Nor is this invention limited to particular gains or number of ranges. The various uses of this gain controlled amplifier will be apparent to one skilled in the art and can easily be made without departing from the spirit and scope of this invention as defined in the following claims.

What is claimed is:

1. A variable gain amplifier, having a plurality of selectable gain ranges, comprising, in combination:
    operational amplifier means,
    a multipath resistor feedback network connected to said operational amplifier means,
    semiconductor switch means for switching said multipath resistor feedback network into a selected one of the paths in said feedback network,
    an analog to digital converter connected to the output of said feedback network,
    microprocessor means for controlling said semiconductor switch means corresponding to the selected gain range,
    said microprocessor means storing in memory a correction factor for each of said gain ranges, and
    said microprocessor means applying the correction factor corresponding to the selected gain range to the output of said analog to digital converter to provide a corrected gain.

2. The variable gain amplifier of claim 1, wherein said feedback network comprises a plurality of voltage semiconductor switch means, said divider paths including switches to select a plurality of voltage ratios determined by said divider paths.

3. The variable gain amplifier of claim 2 wherein said switch means comprise solid state digital switches.

4. The variable gain amplifier of claim 3 wherein said switch means are actuated by bits in PIA latches controlled by said microprocessor.

5. The variable gain amplifier of claim 1 wherein said correction factor is predetermined by said microprocessor means by applying a known input voltage to the amplifier and determining the value of said correction factor required to provide a correct output value from the analog to digital converter corresponding to the selected gain range.

6. The variable gain amplifier of claim 2 wherein said correction factor is predetermined by said microprocessor means by applying a known input voltage to the amplifier and determining the value of said correction factor required to provide a correct output value from the analog to digital converter corresponding to the selected gain range.

7. The variable gain amplifier of claim 3 wherein said correction factor is predetermined by said microprocessor means by applying a known input voltage to the amplifier and determining the value of said correction factor required to provide a correct output value from the analog to digital converter corresponding to the selected gain range.

8. The variable gain amplifier of claim 4 wherein said correction factor is predetermined by said microprocessor means by applying a known input voltage to the amplifier and determining the value of said correction factor required to provide a correct output value from the analog to digital converter corresponding to the selected gain range.

* * * * *